United States Patent
Seidel et al.

(10) Patent No.: US 7,326,465 B2
(45) Date of Patent: Feb. 5, 2008

(54) INTEGRATED ELECTRONIC COMPONENT

(75) Inventors: Robert Seidel, Dresden (DE); Franz Kreupl, Munich (DE); Andrew Graham, Munich (DE)

(73) Assignee: Infineon Technologies AG, Neubiberg (DE)

( * ) Notice: Subject to any disclaimer, the term of this patent is extended or adjusted under 35 U.S.C. 154(b) by 277 days.

(21) Appl. No.: 11/211,168

(22) Filed: Aug. 23, 2005

(65) Prior Publication Data

US 2006/0234080 A1  Oct. 19, 2006

Related U.S. Application Data

(63) Continuation of application No. PCT/EP2004/001158, filed on Feb. 9, 2004.

(30) Foreign Application Priority Data

Feb. 24, 2003  (DE) ................ 103 07 815

(51) Int. Cl.
*B32B 9/00* (2006.01)
(52) U.S. Cl. .................................... 428/408
(58) Field of Classification Search ............... 428/408, 428/698; 977/742; 423/447.1; 427/323
See application file for complete search history.

(56) References Cited

FOREIGN PATENT DOCUMENTS

WO   WO-01 61753 A1   8/2001

OTHER PUBLICATIONS

Delzeit, Lance et al.; "Growth of multiwall carbon nanotubes in an inductively coupled plasma reactor"; Journal of Applied Physics, vol. 91, No. 9, May 1, 2002, pp. 6027-6033.

Delzeit, Lance et al.; "Growth of carbon nanotubes by thermal and plasma chemical vapour deposition processes and applications in microscopy"; Institute of Physics Publishing, NANOTECHNOLOGY, vol. 13, No. 3, Jun. 2002, pp. 280-284.

*Primary Examiner*—Jennifer C. McNeil
*Assistant Examiner*—Daniel Miller
(74) *Attorney, Agent, or Firm*—Dickstein Shapiro LLP

(57) ABSTRACT

An integrated electronic component having a substrate, a metal multilayer system, which is arranged at least on regions of the substrate, and a nonconductive layer, which is arranged on the metal multilayer system and has at least one contact hole, in which at least one carbon nanotube is grown on the metal multilayer system at the bottom of the contact hole. The metal multilayer system includes a high-melting metal layer, a metal separating layer, a catalyst layer, and a final metal separating layer. The high-melting metal layer is composed of at least one of tantalum, molybdenum, and tungsten. The metal separating layer is composed of aluminum, gold, or silver. The catalyst layer is composed of at least one of iron, cobalt, nickel, yttrium, titanium, platinum, and palladium, and a combination thereof. The final metal separating layer, which is arranged above the catalyst layer, is composed of aluminum.

6 Claims, 3 Drawing Sheets

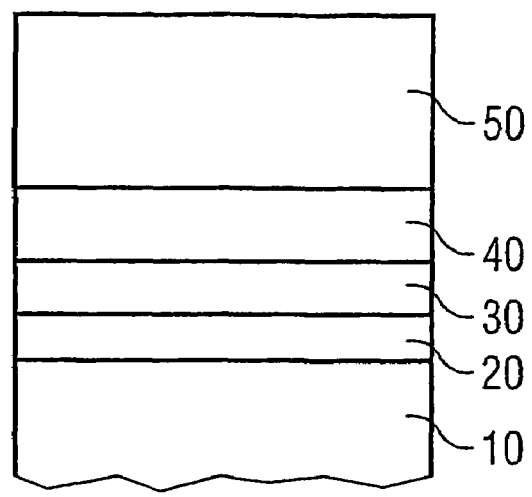
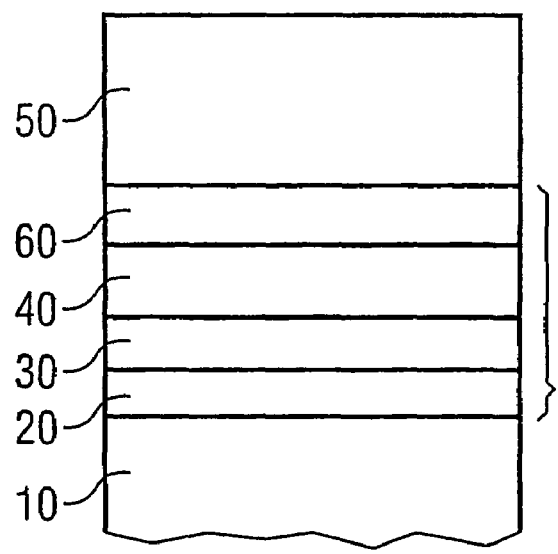 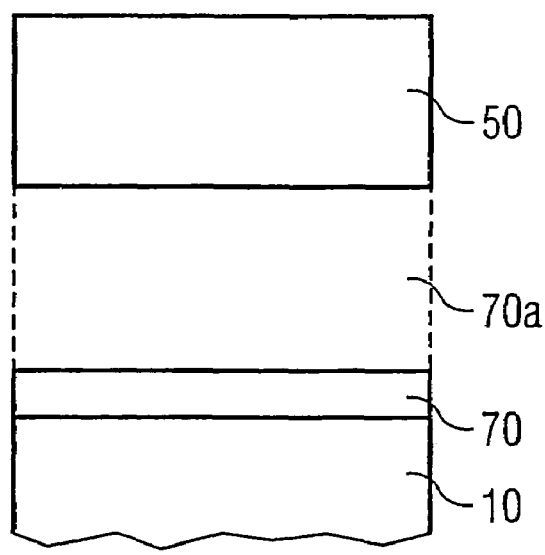

INTEGRATED ELECTRONIC COMPONENT

CROSS-REFERENCE TO RELATED APPLICATION

This application is a continuation of International Patent Application Serial No. PCT/EP2004/001158, filed Feb. 9, 2004, which published in German on Sep. 2, 2004 as WO 2004/075288, and is incorporated herein by reference in its entirety.

FIELD OF THE INVENTION

The present invention relates to an integrated electronic component, to a process for the targeted production of nanotubes in vertical structures, and to the use of a metal multilayer system for the targeted production of nanotubes in vertical structures.

BACKGROUND OF THE INVENTION

In an electronic component which is configured in integrated form, it is customary for two conductive layers which are electrically insulated by a nonconductive layer to be electrically conductively connected to one another by a contact hole being etched through the nonconductive layer. The contact hole is filled with metal, resulting in the production of a metallic through-plating which electrically conductively connects the two conductive layers together.

One drawback of this procedure is that, in particular as the lateral dimensions decrease, i.e. as the diameter of a contact hole passing through the nonconductive layer decreases, and as the vertical extent increases, or at least as the aspect ratio increases, complete filling of the contact hole with metal is problematic and susceptible to defects. In particular, the deposited metal often blocks the upper region of the contact hole, preventing the whole of the contact hole from being filled with metal. Consequently, it is often impossible to produce an electrically conductive connection between the two conductive layers. Moreover, an incompletely filled contact hole leads to reliability problems.

A further drawback of the known procedure is that, in the case of a contact hole with a very low aspect ratio, the conductivity of the metallic through-plating drops considerably, i.e. the metallic through-plating constitutes an element which considerably limits the scaling of a metallization system and therefore of an integrated circuit, in which it is necessary for a plurality of conductive layers to be electrically conductively connected to one another through nonconductive layers in the vertical direction of an electronic component.

On account of the suitability of nanotubes, in particular carbon nanotubes, as metallic conductors and as semiconductors, in the context of nanotechnology it is desirable for nanotubes of this type to be integrated in electronic components.

By way of example, Jung Sang Suh and Jin Seung Lee, Highly Ordered Two-Dimensional Carbon Nanotubes Areas, Applied Physics Letters, Vol. 75, No. 14, pp. 2047-1049, October 1999, have disclosed a process for the self-aligned growth of carbon nanotubes in a perforated $Al_2O_3$ matrix.

Hitherto, nanotubes have only been arranged on the surface of metal contacts by means of a single catalyst layer (DE 100 06 964 C2). In this case, the catalyst and metal layers are normally applied by means of physical deposition (e.g. sputtering) to a flat substrate which has been patterned with resist, and these layers are then patterned using a lift-off process. However, there is at present no tried-and-tested process for vertical structures allowing a catalyst system to be positioned accurately at the bottom of these structures in order then for nanotubes, in particular single-walled carbon nanotubes (SWCNTs) or multi-walled carbon nanotubes (MWCNTs) to be synthesized or grown in the vertical structure with catalytically accelerated growth. Another process is the electrolytic deposition of a corresponding catalyst system for accelerating the growth of these nanotubes in vertical structures. In this case, however, it is difficult to monitor the quantity of catalyst metal which is deposited. Moreover, electrolytic deposition of very small quantities of a catalyst, as required for example for the synthesis of SWCNTs, is scarcely possible. Moreover, if the catalyst system is deposited physically in predefined vertical structures, it is not generally possible to prevent the catalyst also from being deposited on the side walls. Therefore, the nanotubes can also grow from the side walls. In this case, they are not in contact with the base of the vertical structure. A further process consists in applying the catalyst layer before the nonconductive layer and subsequently etching the vertical structures. However, process fluctuations and overetch mean that there has not hitherto been a solution for an accurate etching stop to the order of magnitude of approximately 1 nm. However, this is necessary in order to uncover a single catalyst layer for growth of the nanotube without, however, etching through this catalyst layer.

SUMMARY OF THE INVENTION

Therefore, it is an object of the present invention to provide the targeted production of nanotubes in vertical structures of electronic structures.

The present invention includes an integrated electronic component having a substrate, a metal multilayer system, which is arranged at least on regions of the substrate, and a nonconductive layer, which is arranged on the metal multilayer system and has at least one contact hole, in which at least one carbon nanotube is grown on the metal multilayer system at the bottom of the contact hole. The metal multilayer system includes a high-melting metal layer, a metal separating layer, a catalyst layer, and a final metal separating layer. The high-melting metal layer is composed of at least one of tantalum, molybdenum, and tungsten. The metal separating layer is composed of aluminum, gold, or silver. The catalyst layer is composed of at least one of iron, cobalt, nickel, yttrium, titanium, platinum, and palladium, and a combination thereof. The final metal separating layer, which is arranged above the catalyst layer, is composed of aluminum.

BRIEF DESCRIPTION OF THE DRAWINGS

FIG. 1 diagrammatically depicts the arrangement of substrate, metal multilayer system and nonconductive layer.

FIG. 2a diagrammatically depicts an embodiment according to the present invention, in which a final metal separating layer which is additionally arranged above the catalyst layer is provided.

FIG. 2b diagrammatically depicts a further embodiment according to the present invention, in which the metal multilayer system is arranged repeatedly on top of itself.

DETAILED DESCRIPTION OF PREFERRED EMBODIMENTS OF THE INVENTION

Figure 3A:
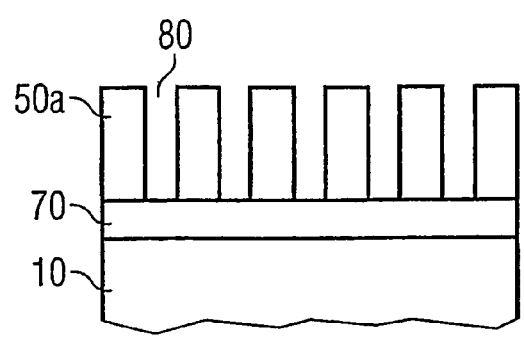
FIG. 3a diagrammatically depicts an element which has been pre-patterned by lithography and etching processes, and in which the metal multilayer system has been uncovered in regions.

The invention provides an integrated electronic component, comprising a substrate, at least one metal multilayer system, which is arranged at least on regions of the substrate, and a nonconductive layer, which is arranged on the metal multilayer system and has at least one contact hole, in which at least one nanotube is grown on the metal multilayer system at the bottom of the contact hole, the metal multilayer system being composed of a high-melting metal layer, a metal separating layer and a catalyst layer.

Therefore, the core concept of the invention is the use of a metal multilayer system which, by combining a plurality of specific metal layers, allows the growth of nanotubes, in particular SWCNTs or MWCNTs, in vertical structures on in particular electrically conductive surfaces (metals).

The invention described here solves the problem of arranging a catalyst which is suitable for the growth of nanotubes in a defined way at the base of a vertical structure by first of all depositing at least one metal multilayer system as defined above on a corresponding substrate. This metal multilayer system is then covered with a nonconductive layer. The vertical structures are subsequently defined in the usual way by lithography and etching processes in the nonconductive layer, so that the metal multilayer system is locally uncovered at the base of the vertical structure. The inclusion of the catalyst metal in the multilayer system used in accordance with the invention results in improved growth of the nanotubes. Furthermore, the problem of stopping the etching process with nanometer accuracy at a catalyst layer can be solved by multiple deposition of a sequence of catalyst layers and separating layers. It is then sufficient to stop at one of the catalyst layers or for the catalyst layer(s) to be uncovered at the edge of the vertical structure following the etching process.

The metal multilayer system which is used according to the invention for the growth of nanotubes comprises a high-melting metal layer, which functions as a bottom contact layer, a metal layer which separates the catalyst from the bottom contact layer below it, and the actual catalyst layer. The yield of nanotubes, in particular SWCNTs or MWCNTs can be increased by successively depositing the sequence of high-melting metal layer/metal separating layer/catalyst layer a number of times. This also facilitates the etching process since, as has already been explained above, the etching process need not be stopped at one specific catalyst layer, but rather simply needs to be stopped at one of the catalyst layers of the multilayer system after a nonconductive layer, which is subsequently patterned by lithography and etching processes, has been deposited on the metal multilayer system in order to produce the vertical structures.

Tantalum, molybdenum and tungsten or silicon have proven suitable for the high-melting metal layer. The melting separating layer may comprise aluminum, gold or silver, preferably aluminum. The metal separating layer, which is arranged between the high-melting metal layer and the catalyst layer, has a very beneficial effect on the growth of the nanotubes, in particular SWCNTs or MWCNTs. It is assumed that the metal of the metal separating layer melts during the process and, by way of example, the likewise molten catalyst material, such as for example iron, is embedded in the liquid phase of, for example, aluminum and thus retains its "insular nature", on which the growth of the nanotubes and the type of tubes (SWCNTs or MWCNTs) are dependent. Moreover, without a separating layer, there is a risk of the catalyst material diffusing into the adjacent layers. The catalyst layer may comprise one or a combination of the following metals: iron, cobalt, nickel, yttrium, titanium, platinum and palladium. Standard materials for the nonconductive layer include, for example, $SiO_2$, $Si_xN_y$, $Al_2O_3$, $ZrO_2$ and $HfO_2$.

In one embodiment of the present invention, the metal multilayer system may additionally include a final metal separating layer, preferably of aluminum, gold or silver, arranged above the catalyst layer.

In the component according to the present invention, the metal multilayer system may be arranged on a first conductive layer as the substrate. Furthermore, a second conductive layer may be arranged in such a form that it is electrically conductively connected to the first conductive layer via the at least one nanotube in the contact hole. The first and second conductive layers may in this case, by way of example, comprise copper and/or aluminum and/or a combination of Ta, TaN, Ti and TiN.

The present invention also relates to a process for the targeted production of nanotubes, in particular single-walled carbon nanotubes (SWCNTs) and multi-walled carbon nanotubes (MWCNTs), in vertical structures, in particular on electrically conductive surfaces, comprising the steps of:

(i) providing a substrate, (ii) successively depositing a high-melting metal layer, a metal separating layer and a catalyst layer, so as to form a metal multilayer system at least on regions of the substrate, (iii) if appropriate repeating step (ii) one or more times, (iv) depositing a nonconductive layer over the metal multilayer system produced in step (ii) and/or (iii), (v) producing at least one contact hole in the nonconductive layer, so that the metal multilayer system extends over the base of the contact hole produced at least in regions, and (vi) growing at least one nanotube on the metal multilayer system in the contact hole.

In the process according to the invention, the substrate may be a first conductive layer, and a second conductive layer can be deposited after step (vi), in such a manner that the first conductive layer is electrically conductively connected to the second conductive layer by the at least one nanotube.

The nanotube(s), in particular the single-walled carbon nanotube(s) (SWCNTs) and/or the multi-walled carbon nanotube(s) (MWCNTs), can be formed in the contact hole in step (vi) by means of CVD processes. The at least one contact hole can be produced in step (v) for example by means of lithographic dry etching. The formation of the metal multilayer system in step (ii) can be effected by means of CVD processes, sputtering or evaporation coating processes. In one embodiment of the process according to the invention, a final metal separating layer, preferably of aluminum, can be additionally deposited over the catalyst layer on the metal multilayer system produced in step (ii) and/or (iii).

The present invention also relates to the use of a metal multilayer system composed of a high-melting metal layer, a metal separating layer and a catalyst layer, for the targeted production of nanotubes, in particular single-walled carbon nanotubes (SWCNTs) and multi-walled carbon nanotubes (MWCNTs), in vertical structures on electrically conductive surfaces, in particular as vias for connecting different metallization levels or in the case of single-walled semiconducting carbon nanotubes as a switching transistor element.

The process according to the invention makes it possible to produce a reliable electrically conductive connection between two conductive layers, which are inherently electrically decoupled by a nonconductive layer, even with contact holes with a very small diameter and a high aspect ratio. The present invention is therefore suitable for the targeted growth of single-walled and multi-walled carbon nanotubes as vias, i.e. for connecting interconnects of different metallization levels. The conductive layers may, for example, be any metallically conductive material, such as for example copper, aluminum, silver, etc., in which case the conductive layers may in the usual way include a bonding, diffusion and antireflection layer, for example Ti, TiN, Ta, TaN and/or a combination of these materials. The electrically nonconductive layer may be a conventional dielectric, such as for example silicon dioxide or silicon nitride or another insulating layer of organic material, such as for example polyimide or any desired combination thereof. The electrically conductive connection by means of at least one nanotube is limited only by the diameter of a nanotube of this type, which in the case of a carbon nanotube is a diameter of approximately 0.4 to 0.7 nm.

Furthermore, the present invention allows the realization of a vertical carbon nanotube transistor if the gate is integrated in the nonconductive layer.

The process according to the invention is distinguished by its simplicity and robustness, i.e. by a low susceptibility to faults, and by the fact that an electrically conductive connection is reliably produced. Therefore, corresponding electrical components can be produced easily and inexpensively even in the case of very fine structures, i.e. in the case of a small diameter of a contact hole.

FIG. 1 shows a substrate 10 on which a metal multilayer system is arranged, the metal multilayer system being composed of a high-melting metal layer 20, a metal separating layer 30 and a catalyst layer 40. A nonconductive layer 50 is arranged on the metal multilayer system, more specifically on the catalyst layer 40.

The substrate 10 may, for example, be a conductive layer of any conductive material, e.g. copper, aluminum, silver, etc. By way of example, tantalum, molybdenum, tungsten and/or silicon can be used for the high-melting metal layer 20. The metal separating layer 30 arranged between high-melting metal layer 20 and catalyst layer 40 has a beneficial effect on the growth of the nanotubes, in particular SWCNTs or MWCNTs. Moreover, without the metal separating layer 30 there is a risk of the catalyst diffusing out of the catalyst layer 40 into the adjacent layers. The metal separating layer 30 may comprise aluminum, gold or silver and is preferably composed of aluminum. The catalyst layer 40 may comprise one or more of the following metals: iron, cobalt, nickel, yttrium, titanium, platinum and palladium. Examples of materials for the nonconductive layer 50 include $SiO_2$, $Si_xN_y$, $Al_2O_3$, $ZrO_2$ and $HfO_2$.

The metal multilayer system illustrated in FIG. 1 can be formed by means of CVD processes, sputtering or evaporation coating processes.

FIG. 2a diagrammatically depicts the sequence of the individual layers as in FIG. 1, with an additional, final metal separating layer 60 arranged on the catalyst layer 40. This final metal separating layer 60 preferably again comprises aluminum.

FIG. 2b shows substantially the same structure as in FIG. 2a, with the metal multilayer system 70, comprising the high-melting metal layer 20, the metal separating layer 30, the catalyst layer 40 and the additional, final metal separating layer 60, arranged a number of times on top of itself (70a).

FIG. 3a diagrammatically depicts the arrangement of substrate 10, metal multilayer system 70 and a pre-patterned nonconductive layer 50a. The present vertical structures (contact holes 80) can be defined by lithography and etching processes in the nonconductive layer 50.

Figure 3B:
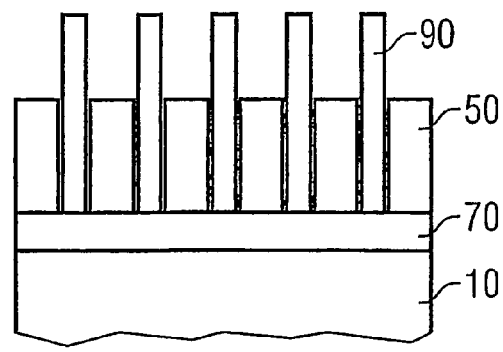
FIG. 3b diagrammatically depicts the pre-patterned element shown in FIG. 3a following the growth of the nanotubes.

FIG. 3b shows nanotubes 90 which have been grown on the metal multilayer system 70 in the vertical structures of the pre-patterned nonconductive layer 50a. The nanotubes 90, in particular single-walled carbon nanotubes (SWCNTs) and/or multi-walled carbon nanotubes (MWCNTs), can be formed in the contact holes 80 by means of CVD processes. The structure according to the invention causes the nanotubes 90 to grow selectively on the metal multilayer system 70 in the contact holes 80, with undesirable growth from the side walls being avoided.

Figure 4A:
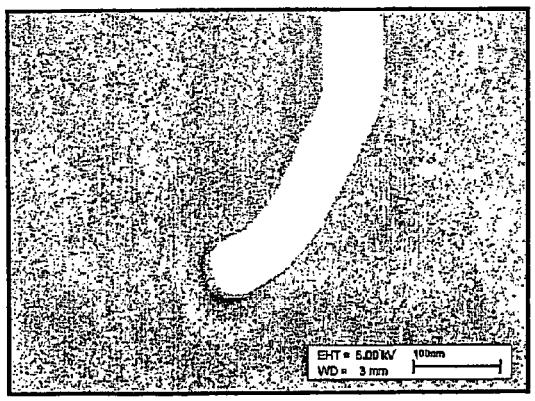
FIGS. 4a and 4b show scanning electron microscope images of MWCNTs which have been grown on the metal multilayer systems used in accordance with the invention.
Figure 4B:
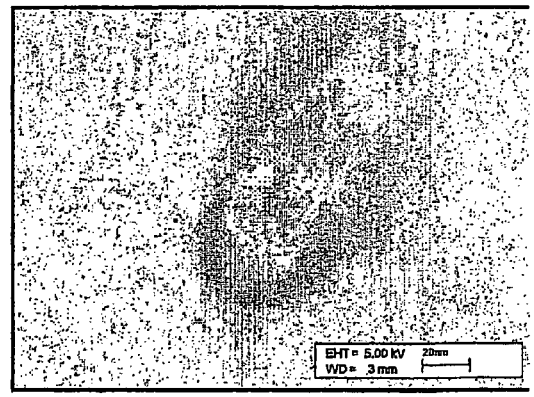
Figure 5:
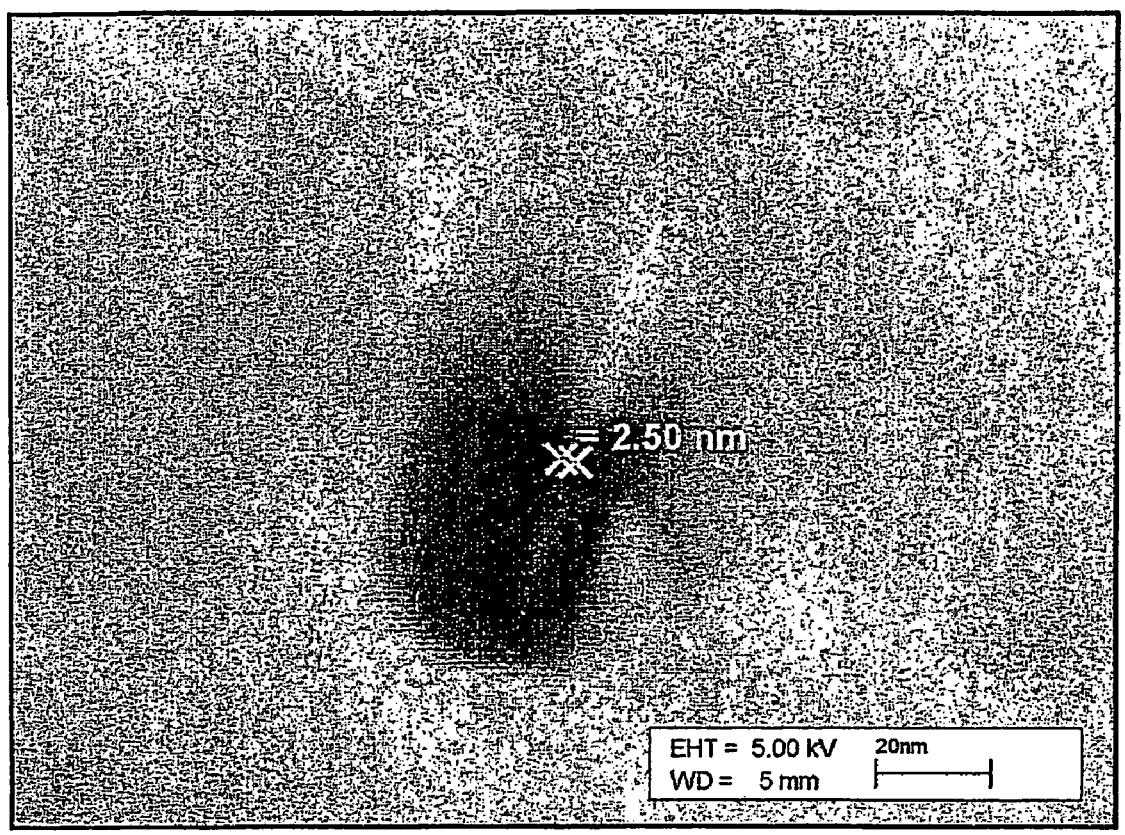
FIG. 5 shows a scanning electron microscope image of SWCNTs which have been grown on the metal multilayer systems used in accordance with the invention.

FIGS. 4a, 4b and 5 show scanning electron microscope images of MWCNTs (FIGS. 4a and 4b) and SWCNTs (FIG. 5). The production of nanotubes in vertical structures in accordance with the invention results not only in the targeted formation of MWCNTs (FIGS. 4a and 4b) and SWCNTs (FIG. 5) but also in targeted avoidance of the growth of the nanotubes from the side walls, as can be seen from FIGS. 4a to 5.

What is claimed is:

1. An integrated electronic component, comprising:
   a substrate;
   at least one metal multilayer system, which is arranged at least on regions of the substrate and comprises:
      a high-melting metal layer composed of at least one metal selected from the group consisting of tantalum, molybdenum, and tungsten;
      a metal separating layer composed of aluminum, gold, or silver;
      a catalyst layer composed of at least one metal selected from the group consisting of iron, cobalt, nickel, yttrium, titanium, platinum, and palladium, and a combination thereof; and
      a final metal separating layer, which is arranged above the catalyst layer and is composed of aluminum; and
   a nonconductive layer, which is arranged on the metal multilayer system and has at least one contact hole, in which at least one carbon nanotube is grown on the metal multilayer system at the bottom of the contact hole.

2. The component as claimed in claim 1, wherein the nonconductive layer is composed of a material selected from the group consisting of $SiO_2$, $Si_xN_y$, $Al_2O_3$, $ZrO_2$, and $HfO_2$, and a combination thereof.

3. The component as claimed in claim 1, wherein the carbon nanotube is a single-walled carbon nanotube (SWCNT) or a multi-walled carbon nanotube (MWCNT).

4. The component as claimed in claim 1, wherein the metal multilayer system is arranged on a first conductive layer as the substrate.

5. The component as claimed in claim 4, further comprising a second conductive layer, wherein the first conductive layer is electrically conductively connected to the second conductive layer via the at least one nanotube in the contact hole.

6. The component as claimed in claim 5, wherein the first and second conductive layers comprise at least one material selected from the group consisting of copper, aluminum, and a combination of Ta, TaN, Ti, and TiN.

* * * * *